United States Patent
Yang et al.

(10) Patent No.: US 12,243,850 B2
(45) Date of Patent: Mar. 4, 2025

(54) DEVICES, SYSTEMS, AND METHODS FOR STACKED DIE PACKAGES

(71) Applicant: Flex Ltd., Singapore (SG)

(72) Inventors: Cheng Yang, Shanghai (CN); Dongkai Shangguan, San Jose, CA (US)

(73) Assignee: Flex Ltd., Singapore (SG)

( * ) Notice: Subject to any disclaimer, the term of this patent is extended or adjusted under 35 U.S.C. 154(b) by 426 days.

(21) Appl. No.: 17/392,995

(22) Filed: Aug. 3, 2021

(65) Prior Publication Data

US 2022/0045034 A1    Feb. 10, 2022

(30) Foreign Application Priority Data

Aug. 4, 2020 (CN) .......................... 202010771808.5

(51) Int. Cl.
*H01L 25/065* (2023.01)
*H01L 23/00* (2006.01)

(52) U.S. Cl.
CPC .......... *H01L 25/0657* (2013.01); *H01L 24/06* (2013.01); *H01L 24/08* (2013.01); *H01L 24/32* (2013.01); *H01L 24/48* (2013.01); *H01L 24/94* (2013.01); *H01L 2224/0613* (2013.01); *H01L 2224/08145* (2013.01); *H01L 2224/32145* (2013.01); *H01L 2224/32225* (2013.01); *H01L 2224/48225* (2013.01); *H01L 2225/0651* (2013.01); *H01L 2225/06524* (2013.01); *H01L 2225/06562* (2013.01); *H01L 2225/06565* (2013.01); *H01L 2225/06568* (2013.01); *H01L 2924/1431* (2013.01); *H01L 2924/1432* (2013.01); *H01L 2924/1433* (2013.01); *H01L 2924/1434* (2013.01)

(58) Field of Classification Search
CPC ......... H10B 80/00; H01L 24/06; H01L 24/08; H01L 24/32; H01L 24/48; H01L 24/94; H01L 25/0657; H01L 25/0652
USPC ................................................. 257/690, 777
See application file for complete search history.

(56) References Cited

U.S. PATENT DOCUMENTS 10,784,178 B2 * 9/2020 Ko ...................... H01L 24/96
2020/0212012 A1 * 7/2020 Meyers ................ H01L 21/561

\* cited by examiner

*Primary Examiner* — Jasmine J Clark
(74) *Attorney, Agent, or Firm* — Sheridan Ross P.C.

(57) ABSTRACT

A package includes a first chip stack. The first chip stack includes a first chip including first bonding structures, a second chip including second bonding structures facing the first bonding structures and bonded to the first bonding structures, and a first electrical contact on the second chip. At least a portion of the first electrical contact does not overlap with the first chip in a plan view.

20 Claims, 9 Drawing Sheets

DEVICES, SYSTEMS, AND METHODS FOR STACKED DIE PACKAGES

CROSS REFERENCE TO RELATED APPLICATIONS

This application claims priority under 35 U.S.C. § 119 to Chinese Application No. 202010771808.5 filed on Aug. 4, 2020, the disclosure of which is hereby incorporated by reference, in its entirety, for all that it teaches and for all purposes.

FIELD

The present disclosure is generally directed to devices, systems, and methods for stacked die packages.

BACKGROUND

Many modern electronic devices utilize packages that include stacked substrates or dies with circuit elements mounted on and/or formed in the substrates and electrically connected to other circuit elements in the stack. The flexibility, thickness, and footprint of related art electronic packages are limited by various considerations including bonding techniques, wiring requirements, and/or manufacturing/transportation processes.

SUMMARY

At least one example embodiment is directed to a package includes a first chip stack including a first chip including first bonding structures, a second chip including second bonding structures facing the first bonding structures and bonded to the first bonding structures, and a first electrical contact on the second chip. At least a portion of the first electrical contact does not overlap with the first chip in a plan view.

At least one example embodiment is directed to a method including forming a plurality of grooves in a first wafer including a plurality of first chips, bonding the first wafer to a second wafer including a plurality of second chips to form bonded structure, thinning the first wafer in the bonded structure to remove the plurality of grooves, and dicing the thinned bonded structure to form a plurality of first chip stacks. Each first chip stack includes one of the first plurality of chips and one of the second plurality of chips.

At least one example embodiment is directed to a package including a first chip stack including a first chip including first bonding structures, a second chip including second bonding structures facing the first bonding structures and bonded to the first bonding structures, and a first electrical contact on the second chip. The first electrical contact does not overlap with the first chip in a plan view. The package includes a second chip stack adhered to the first chip stack. The second chip stack includes a third chip including third bonding structures, a fourth chip including fourth bonding structures facing the third bonding structures and bonded to the third bonding structures, and a second electrical contact on the fourth chip. The second electrical contact does not overlap with the third chip in the plan view. The package further includes a support substrate that supports the first chip stack and the second chip stack.

DETAILED DESCRIPTION

The flexibility, thickness, and footprint of related art electronic/semiconductor packages are limited by various considerations including bonding techniques, wiring requirements, manufacturing processes, and/or handling processes. For example, in stacked die wire bonding, die thinning is limited at a minimum 20~30 um thickness due to handling and die attaching processes. In addition, staggered placement is utilized to leave the space for wire bonding, which limits the flexibility of the stacking structure. In through silicon via (TSV) stacking, a through silicon via process is costly, and die thickness is also limited by die to wafer bonding or wafer to wafer bonding. In fanout stacked packages, double sided fanout and redistribution layer (RDL) wiring is used, which creates longer signal paths and a larger area when the number of input/output (I/O) terminals is large.

Inventive concepts address these and other shortcomings of the related art by achieving double density with face to face wafer to wafer (original or reconstituted) bonding, thinned and stacked with wire bonding. Face to face bonding in accordance with example embodiments reduces die thickness to about ~10 um (down from 20 um to 30 um), and the bonded wafer/die (e.g. two die) may have similar thicknesses as a single die in a normal stack. In addition, inventive concepts avoid the costs associated with TSV stacks, even for larger numbers of I/O interconnections. That is, inventive concepts with wafer/die to wafer/die bonding can accommodate large numbers of I/O connections, which may be useful for some applications, e.g., a memory chip bonded to a processor chip.

Throughout the instant description, it should be understood that unless a specific reference to a set of elements is needed, a general reference may be used. For example, for a set of individual elements xxa, xxb, xxc, xxd, the set of elements may be generally referred to as "xx."

It should be further understood that FIGS. 2-8 below show substantially accurate relative positional relationships of the elements depicted therein and can be relied upon as support for such positional relationships. For example, the figures are generally accurate with respect to showing positions of overlapping elements.

Figure 1:
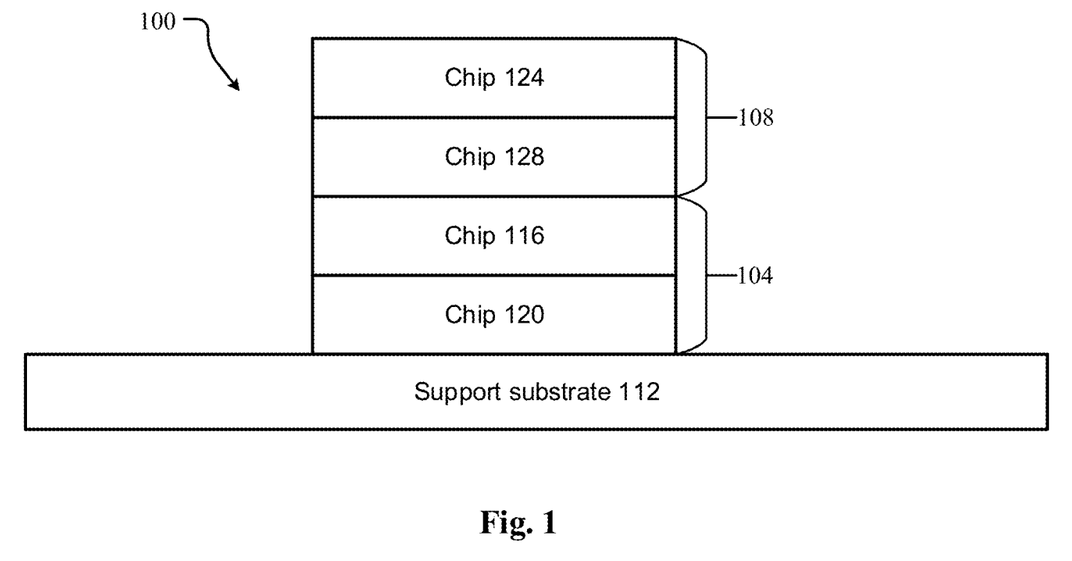
FIG. 1 illustrates a block diagram of a package according to at least one example embodiment.

FIG. 1 illustrates a block diagram of a package 100 according to at least one example embodiment. The package 100 includes a first chip stack 104 and a second chip stack 108 (each chip stack also referred as a stack herein), and a support substrate 112 that supports the first and second chip stacks 104/108. As shown, the second chip stack 108 is stacked on the first chip stack 104. For example, the second chip stack 108 may be adhered to the first chip stack 104 with an adhesive or other suitable bonding material. Likewise, the first chip stack 104 may be adhered to the support substrate 112 with an adhesive or other suitable bonding material. In at least one example embodiment, flip chip connections are used for adhering one or more of the chips to one another and/or for adhering the chip stack 104 to the support substrate 112 (if, for example, face-to-face bonding between chips 116 and 120 is not needed). The first chip stack 104 includes chips 116 and 120, and the second chip stack 108 includes chips 124 and 128. However, each chip stack 104 and 108 may include more or fewer chips depending on design preferences. Each chip in each chip stack 104 and 108 may have the same or different thicknesses, and each chip stack 104 and 108 may have the same or different total thicknesses depending on design preferences.

The support substrate 112 may include any known support structure for supporting chips and/or other circuit elements, for example, a printed circuit board (PCB). The support substrate 112 may be flexible in whole or in part, or rigid in whole or in part.

In at least one example embodiment, chip 116 is flip-chip connected to chip 120 (or vice versa) and/or chip 124 is flip-chip connected to chip 128 (or vice versa).

Each chip (or die) 116, 120, 124, 128 in the chip stacks 104/108 may include a semiconductor substrate, such as silicon, having electronic components mounted on and/or formed therein. For example, in the event that the package 100 is a memory device, one chip in a chip stack may include electronic memory while the other chip in the chip stack may include processing/control circuitry for controlling the electronic memory. The electronic memory may be a computer readable medium including instructions that are executable by the processor. The memory may include any type of computer memory device, and may be volatile or non-volatile in nature. In some embodiments, the memory may include a plurality of different memory devices. Non-limiting examples of memory include Random Access Memory (RAM), Read Only Memory (ROM), flash memory, Electronically-Erasable Programmable ROM (EEPROM), Dynamic RAM (DRAM), etc. The memory may include instructions that enable the processor to control various functions and to store data. The memory may be local (e.g., integrated with) the processor and/or separate from the processor. The processor may correspond to one or many computer processing devices. For instance, the processor may be provided as a Field Programmable Gate Array (FPGA), an Application-Specific Integrated Circuit (ASIC), any other type of Integrated Circuit (IC) chip, a collection of IC chips, a microcontroller, a collection of microcontrollers, or the like. As a more specific example, the processor may be provided as a microprocessor, Central Processing Unit (CPU), or plurality of microprocessors that are configured to execute the instructions sets stored in memory. The processor may perform read and/or write operations for the memory and/or enable various functions upon executing the instructions stored in memory.

It should be further appreciated that one or more other chips in the package 100 may include one or more communication interfaces that enable communication with other elements in the package 100. These communication interfaces include wired and/or wireless communication interfaces for exchanging data and control signals between one another. Examples of wired communication interfaces/connections include Ethernet connections, HDMI connections, connections that adhere to PCI/PCIe standards and SATA standards, and/or the like. Examples of wireless interfaces/connections include Wi-Fi connections, LTE connections, Bluetooth connections, NFC connections, and/or the like.

Additionally or alternatively, the chips 116, 120, 124, and 128 may comprise other circuitry generally known to be included in semiconductor packages, for example, integrated circuits (IC), application specific ICs (ASICs), and the like. Although not explicitly shown, it should be appreciated that the chips 116, 120, 124, and 128 may be encased in an encapsulant or potting material to insulate the chips from the external environment. Similarly, the entire package 100 may be placed in a protective case or encapsulant if desired. Details of the package 100 stacking of the chips 116, 120, 124, and/or 128 are described in more detail below with reference to the figures.

Figure 2:
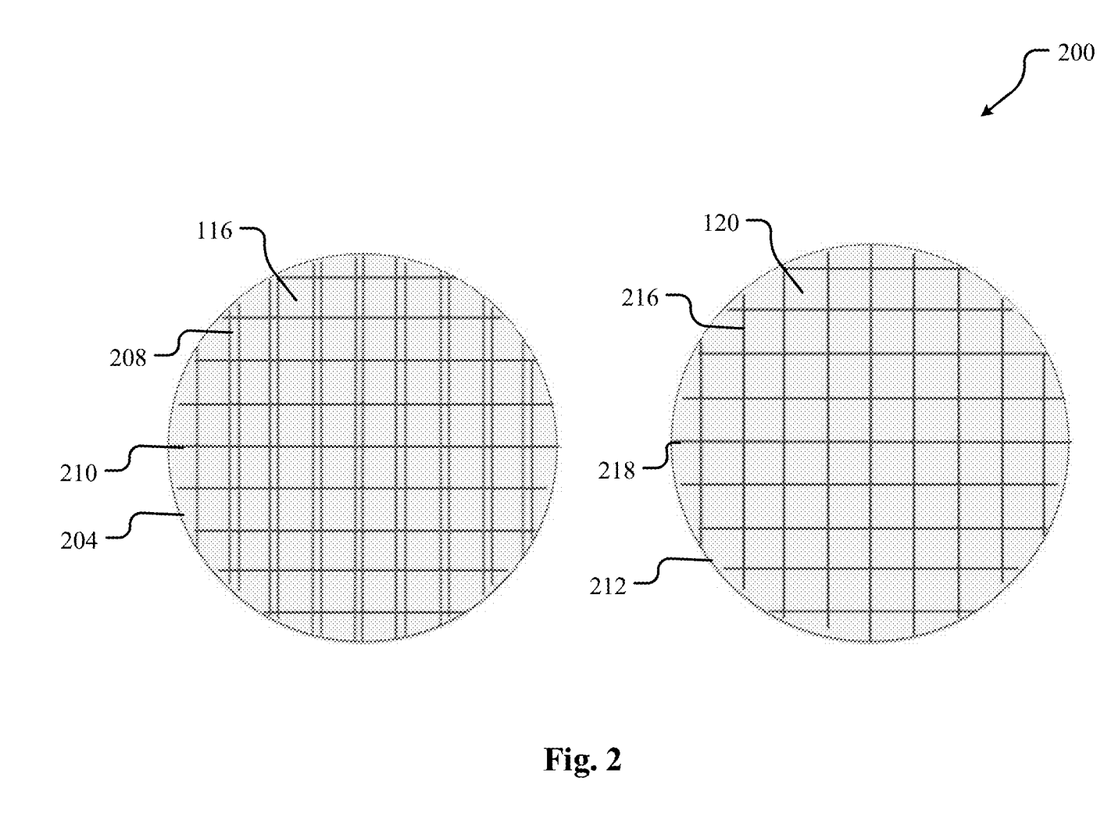
FIG. 2 illustrates a set of wafers according to at least one example embodiment.

FIG. 2 illustrates a set of wafers 200 according to at least one example embodiment. The set of wafers 200 includes a first wafer 204. FIG. 2 further illustrates scribe lines or saw streets 208/210 for the first wafer 204, where the scribe lines 208/210 delineate areas that include individual chips or die, for example, chip 116 (i.e., one of the squares in the wafer 200). Scribe lines 208 extend in a vertical direction and are illustrated as being wider than scribe lines 210 that extend in a horizontal direction (where the width of a scribe line 208 is between two adjacent vertical lines). As discussed in more detail below, the wider scribe lines 208 contribute to the stacked structure of inventive concepts. For example, scribe lines 208 may correspond to grooves in a wafer (see, for example, FIGS. 7A to 8B).

FIG. 2 further illustrates a second wafer 212 with scribe lines 216/218 that delineate areas that include individual chips or die on the second wafer 212, for example, chip 120 in FIG. 1. Wafer 212 illustrates an example where scribe lines 216/218 are substantially the same width. However, example embodiments may also employ a wafer 212 with scribe lines the same as that shown in FIG. 1, where vertical scribe lines 216 are wider than horizontal scribe lines 218. In this case, the wider scribe lines 216 may correspond to grooves in the wafer (see, for example, FIGS. 8A and 8B).

Still with reference to FIG. 2, the first wafer 204 and/or the second wafer 212 may be reconstituted wafers. Reconstituted wafers may be used to enable different die or chip size for wafer to wafer bonding (see, for example, FIGS. 3A and 3B where each chip is a different size). A reconstituted wafer may be a carrier wafer that includes individual first chips or die that have already undergone semiconductor processing (e.g., circuit formation) on a different wafer. The different wafer is diced to form the individual first chips, and the individual first chips are then placed on the carrier wafer. The reconstituted wafer can also optionally be over-molded and wired (e.g., RDL wiring). According to at least one example embodiment, the carrier wafer and another wafer with individual second chips are bonded to one another, and the bonded wafers are diced to form individual chip stacks (e.g., chip stacks 104 or 108). Here, it should be appreciated that the formation of wiring for a chip in a reconstituted wafer may occur before or after over molding depending on design preferences. In addition, as noted above, the another wafer with individual second chips may be a reconstituted or original wafer depending on design preferences. As noted above, over-molding and RDL wiring are optional processes that may be useful for some applications, but not others. For example, over-molding may be desired when one of the die or chips in a stack is much smaller than the other die or chip. In this case, fanout (i.e., over-molding and RDL) may help to redistribute I/O terminals by creating interconnect I/O pads on both top and bottom sides of a chip.

Figure 3A:
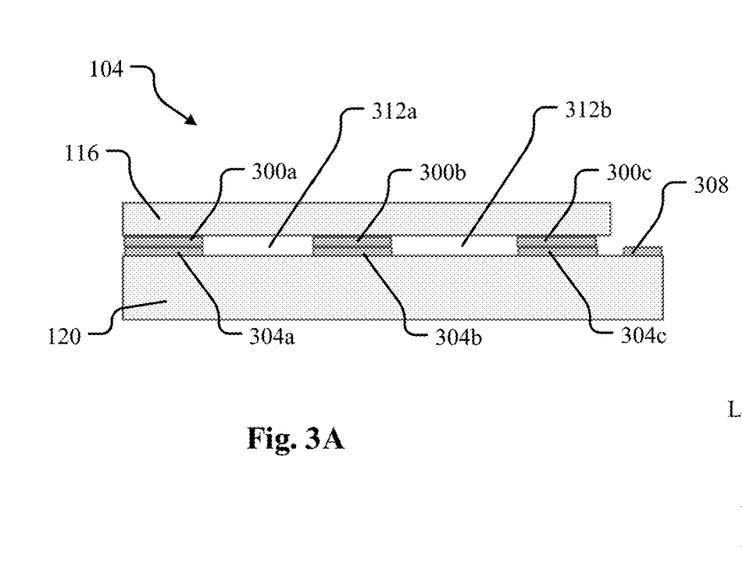
FIG. 3A illustrates a cross sectional view of a chip stack according to at least one example embodiment.
Figure 3B:
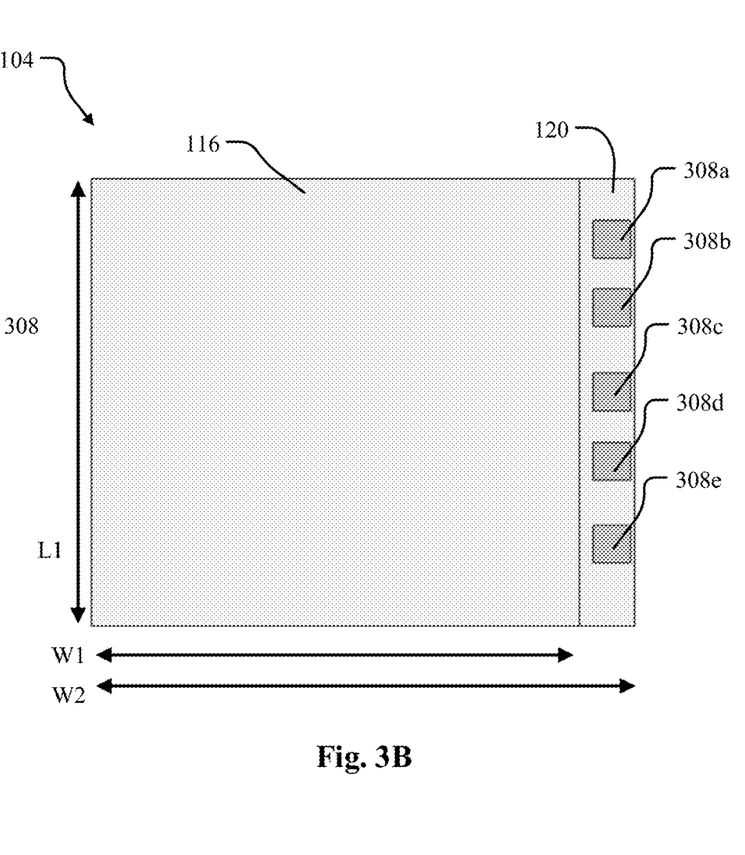
FIG. 3B illustrates a plan view of the chip stack in FIG. 3A according to at least one example embodiment.

FIG. 3A illustrates a cross sectional view of a chip stack according to at least one example embodiment. FIG. 3B illustrates a plan view of the chip stack in FIG. 3A according to at least one example embodiment. The cross section view in FIG. 3A may be taken along a horizontal line in FIG. 3B that passes through one of the electrical contacts 308a to 308e. The same relationship is true for remaining figures (i.e., FIGS. 4A to 8B). The contacts 308a to 308e may be for making electrical and/or mechanical connection with a support substrate for example. Thus, in the event of only mechanical connection, the contacts 308 need not be conductive (the same is true for contacts 500 and 800 discussed below with reference to FIGS. 5A, 5B, 8A, and 8B).

FIG. 3A illustrates the first chip stack 104 from FIG. 2 that includes a first chip 116 and a second chip 120. The chip 116 and the chip 120 may be bonded to one another. For example, the first chip 116 includes first bonding structures 300a, 300b, 300c, and the second chip 120 includes second bonding structures 304a, 304b, 304c facing the first bonding structures and bonded to the first bonding structures 300a, 300b, 300c. In at least one example embodiment, the bonding structures 300 and 304 are bonding pads, for example, copper bonding pads. However, example embodiments are not limited thereto and any suitable bonding structures may be used (e.g., solder bumps, adhesive, and/or the like). One or more of the bonding structures 300 and 304 may carry electrical signals between the chips 116 and 120 if desired.

FIG. 3A further illustrates gaps 312a and 312b between the chips 116 and 120. The gaps 312 may be filled with dielectric material, bonding material (e.g., resin), and/or other material according to design preferences. Additionally or alternatively, the bonding structures 300 and 304 may be embedded within each chip 116 and 120 so that bonding surfaces of the bonding structures 300 and 304 are coplanar with a respective surface of the chips 116 and 120.

FIG. 3A also illustrates a first electrical contact 308 on the second chip 120. As shown in FIGS. 3A and 3B, at least a portion of the first electrical contact 308 does not overlap with the first chip 116 in a plan view. In the example of FIGS. 3A and 3B, the entirety of the electrical contact 308 does not overlap with the first chip 116, but some of the electrical contact 308 may overlap with the first chip 116 if desired. The electrical contact 308 may function as an electrical contact for the chip stack 104 to external circuitry, for example, to circuitry on the support substrate 112 using a bonding wire (see FIG. 4, for example). As shown, the first electrical contact 308 is located at a first side of the second chip 120.

In FIGS. 3A and 3B, a width W1 of the first chip 116 is less than a width W2 of the second chip 120. Thus, the first chip 116 may be formed with the scribe lines 208 and 210 from FIG. 2, while the second chip 120 may be formed with the scribe lines 216/218. As also shown, the first chip 116 and the second chip 120 have a same length L1. In addition, as shown in FIG. 3B, three sides of each of the first chip 116 and the second chip 120 are aligned with one another, and a plurality of first contacts 308 are included as 308a to 308e. The contacts 308a to 308a may have the same or similar size and be aligned with one another and arranged at regular intervals along one side of the second chip 120. Each contact 308a to 308e may make electrical contact to another element on the support substrate 112 with a bonding wire, for example.

Figures 4A, 4B:
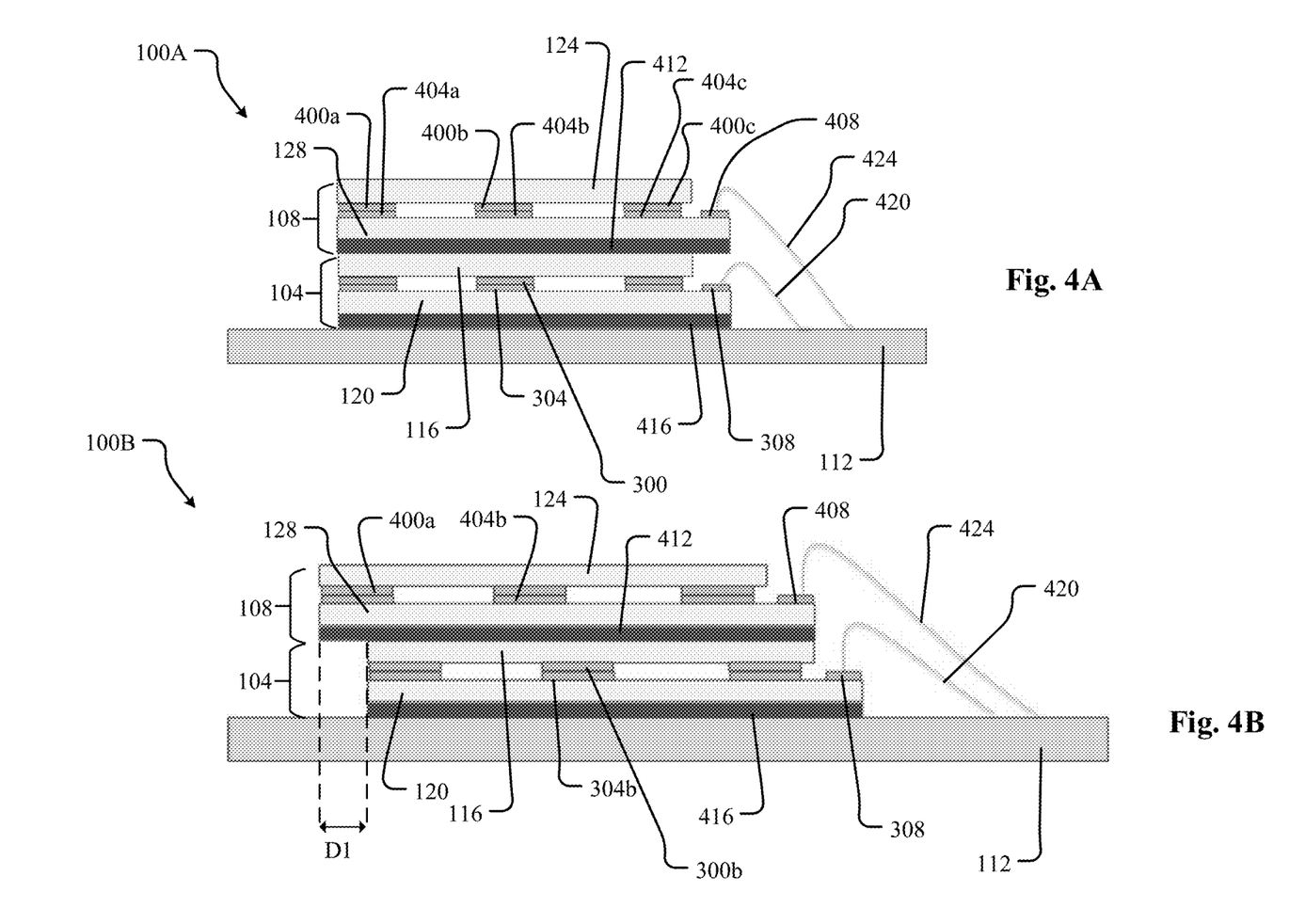
FIG. 4A illustrates a cross sectional view of a chip stack according to at least one example embodiment.
FIG. 4B illustrates a plan view of the chip stack in FIG. 4A according to at least one example embodiment.

FIGS. 4A and 4B illustrate packages according to at least one example embodiment. FIG. 4A illustrates a package 100A that includes chip stacks 104 and 108. Each chip stack 104 and 108 has a same structure as the chip stack 104 from FIGS. 3A and 3B. As shown, the second chip stack 108 is adhered to the first chip stack 104 with adhesive 412 and includes a third chip 124 including third bonding structures 400a, 400b, and 400c. The second chip stack 108 includes a fourth chip 128 including fourth bonding structures 404a, 404b, and 404c facing the third bonding structures 400a, 400b, and 400c and bonded to the third bonding structures 400a, 400b, and 400c. The second chip stack 108 further includes a second electrical contact 408 on the fourth chip 128. Like the contact 308, at least a portion of the second electrical contact 408 does not overlap with the third chip 124 (and the first chip 116) in the plan view. FIG. 4A further illustrates the support substrate 112 that supports the first chip stack 104 and the second chip stack 108. The chip stack 104 is adhered to the support substrate 112 with an adhesive 416.

As shown, in a cross sectional view, a length of the first chip 116 is less than a length of the second chip 120, and a length of the third chip 124 is less than a length of the fourth chip 128, and the first electrical contact 308 and the second electrical contact 408 overlap one another in the plan view (e.g., entirely overlap one another or partially if desired). For example, the electrical contacts 308 and 408 are aligned with one another. Further, in FIG. 4A, the first chip stack 104 and the second chip stack 108 are aligned with one another.

The package 100A further includes a first bonding wire 420 electrically and/or mechanically connected to the first electrical contact 308, and a second bonding wire 424 electrically and/or mechanically connected to the second electrical contact 408. The bonding wires 420 and 424 are electrically connected to the support substrate 112, for example, a contact pad or electrical trace on the support substrate 112. The configuration of the package 100A in FIG. 4A is useful for applications where the first chip stack 104 and/or the fourth chip 128 are thick enough so that the looping bonding wire 420 is possible. In some example embodiments, a thickness of the chip 116 controls whether looping bonding wire 420 is possible.

FIG. 4B illustrates a package 110B, which includes the same chip stacks 104 and 108 as in FIG. 4A, except that the first chip stack 104 and the second chip stack 108 are offset from one another by a distance D1. This configuration may be useful for applications where the chip stack 104 and/or the fourth chip 128 are thin enough that looping bonding wire 420 is not possible. The offset may prevent or reduce the likelihood of the bonding wires 420 and 424 touching and/or the likelihood of bonding wire 420 contacting adhesive layer 412 if chip 116 is too thin. The offset distance D1 is a design parameter set based on design preference and or wire bonding capability.

Figure 5A:
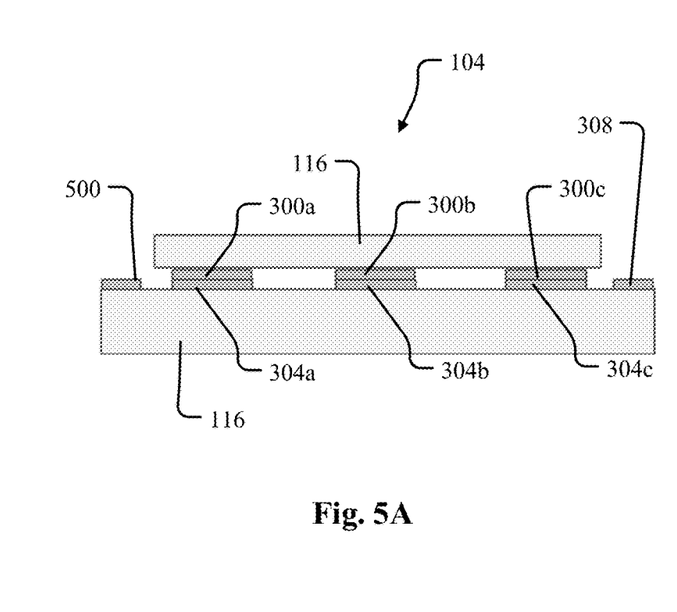
FIG. 5A illustrates a cross sectional view of a chip stack according to at least one example embodiment.
Figure 5B:
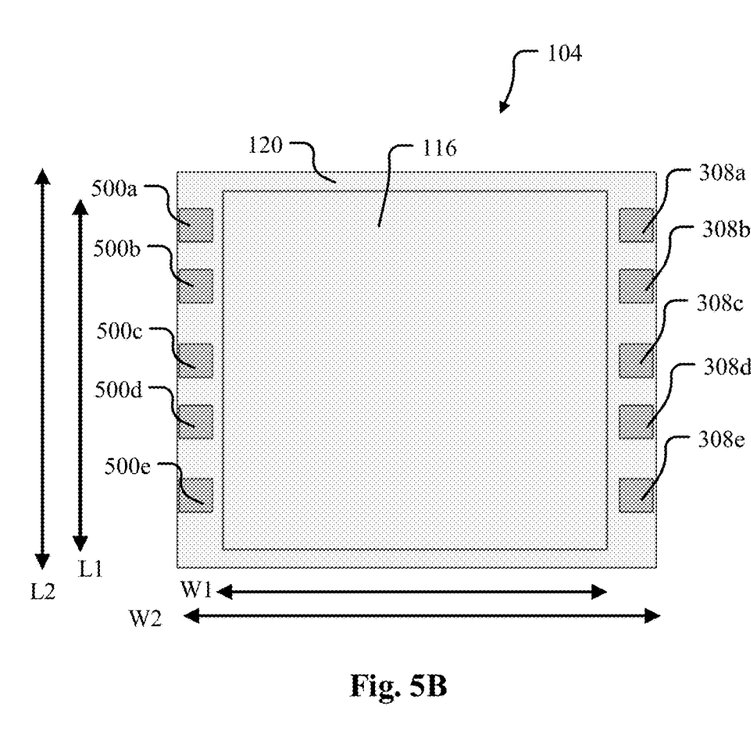
FIG. 5B illustrates a plan view of the chip stack in FIG. 5A according to at least one example embodiment.

FIG. 5A illustrates a cross sectional view of a chip stack according to at least one example embodiment. FIG. 5B illustrates a plan view of the chip stack in FIG. 5A according to at least one example embodiment. FIGS. 5A and 5B include many of the same elements as FIGS. 3A to 4B, and thus a description of these elements is not repeated. Compared to FIGS. 3A and 3B, for example, FIGS. 5A and 5B illustrate that the first chip 116 is smaller than the second chip 120. For example, a length L1 of chip 116 is less than a length L2 of the chip 120, and a width W1 of the chip 116 is less than a width W2 of the chip 120. As illustrated, this allows for the inclusion of additional electrical contacts 500*a*, 500*b*, 500*c*, 500*d*, and 500*e* located at a second side of the second chip 120 opposite the first side of the second chip 120 that includes the electrical contacts 308. Like electrical contacts 308, the electrical contacts 500 may be aligned with one another in a length direction and arranged at regular intervals. In addition, electrical contacts 300 and 500 may be aligned with one another in a width direction. For example, electrical contact 300*a* is aligned with electrical contact 500*a*, electrical contact 300*b* is aligned with electrical contact 500*b*, and so on. The configuration in FIGS. 5A and 5B may be useful for applications that require a larger number of connections from the support substrate 112 to the chip stack 104.

The chip stack 104 in FIGS. 5A and 5B may then be mounted and wired to a support substrate 112 to form a package. Although not explicitly shown, it should be appreciated that another chip stack 108 having a same or different structure than the chip stack 104 and a support substrate 112 may be added to the chip stack 104 in FIGS. 5A and 5B to form a package (as in FIGS. 4A and 4B) if desired.

Figure 6A:
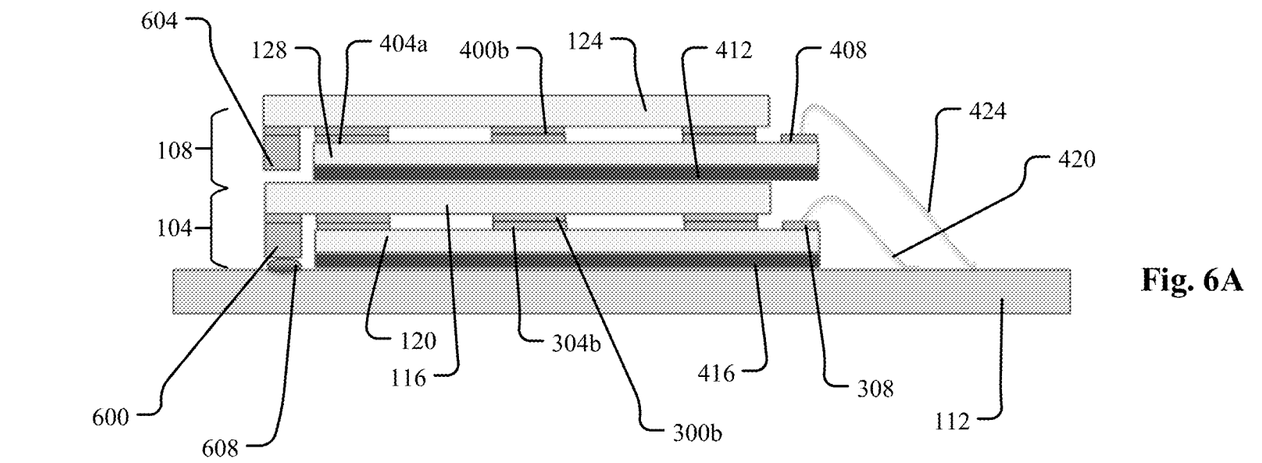
FIG. 6A illustrates a cross sectional view of a chip stack according to at least one example embodiment.
Figure 6B:
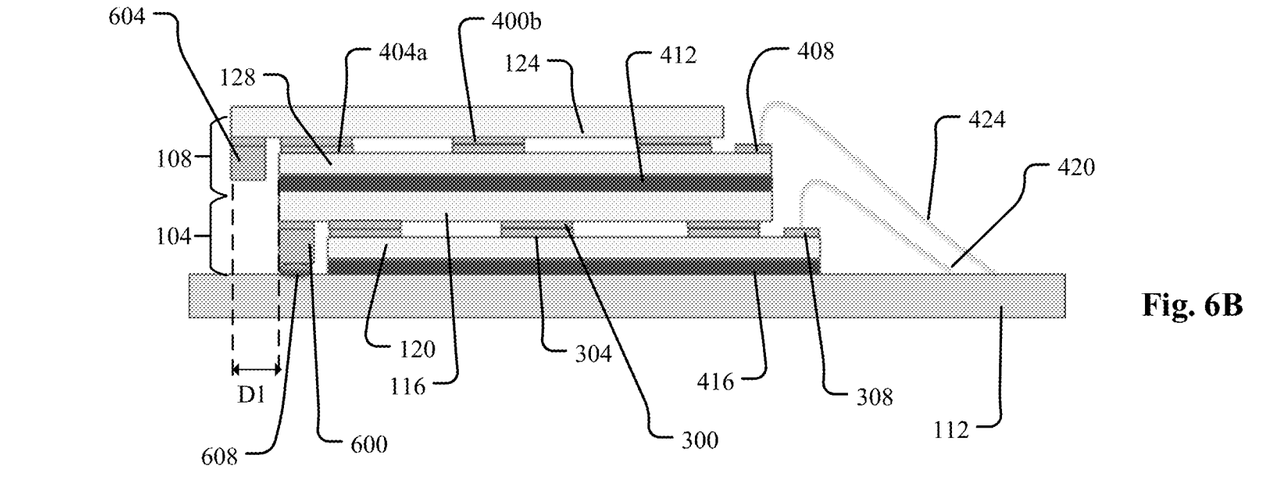
FIG. 6B illustrates a plan view of the chip stack in FIG. 6A according to at least one example embodiment.

FIGS. 6A and 6B illustrate packages according to at least one example embodiment. FIGS. 6A and 6B include many of the same elements as the previous figures, and as such, a description of these elements is not repeated. As in FIG. 4A, the chip stacks 104 and 108 in FIG. 6A are aligned with one another, while as in FIG. 4B, the chip stacks 104 and 108 in FIG. 6B are offset from one another by a distance D1. The distance D1 is a design parameter set based on empirical evidence and/or preference.

FIGS. 6A and 6B differ from the previous figures in that, for example, each chip stack 104 and 108 includes an additional contact structure. For example, chip stack 104 includes a contact structure 600, which may extend from a bottom surface of the chip 116 to a surface of the support substrate 112. The contact structure 600 may be bonded to the surface of the support substrate 112 by a bump 608 (e.g., a solder bump) and electrically and/or mechanically connect an element on the chip 116 to the support substrate 112. FIGS. 6A and 6B further illustrate a contact structure 604 extending from a bottom surface of the chip 124. Although not explicitly shown, the contact structure 604 may be electrically and/or mechanically connected to a top surface of the chip 116 in FIG. 6A by a solder bump. Similarly, the contact structure 604 in FIG. 6B may be extend all the way to the support substrate 112 and electrically connected to a solder bump on the support substrate 112. Here, it should be appreciated that reference to a "bottom" surface or a "top" surface above considers the reference point to be the support substrate 112, and not necessarily the top or bottom surface of a chip in a flip-chip connection configuration. In other words, if, for example, chip 116 is flip-chip connected to chip 120, then what is sometimes referred to as a top surface of the chip 116 that has been processed to include circuitry faces the support substrate 112 and may be referred to as the bottom surface. Thus, the terms "top" and "bottom" above do not necessarily indicate whether a surface of a chip has been processed to include circuitry.

Figure 7A:
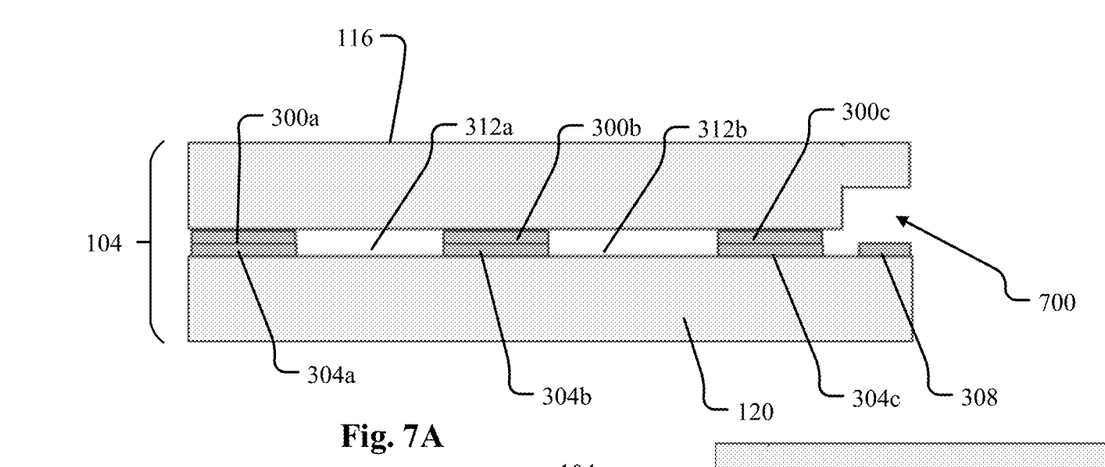
FIG. 7A illustrates a cross sectional view of a chip stack according to at least one example embodiment.
Figure 7B:
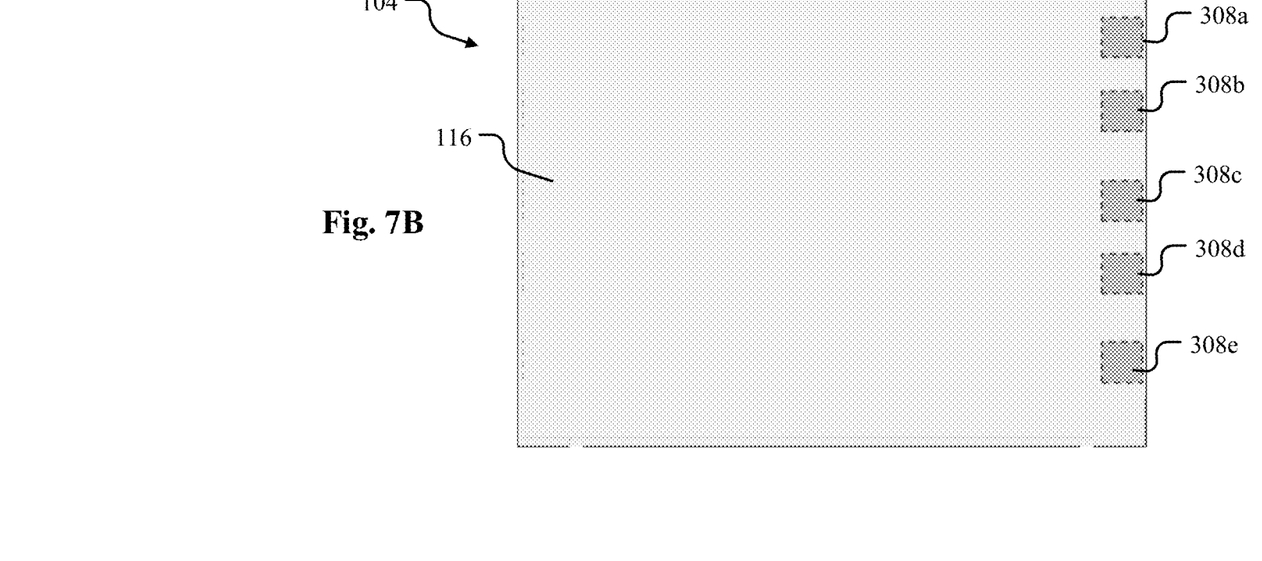
FIG. 7B illustrates a plan view of the chip stack in FIG. 7A according to at least one example embodiment.

FIGS. 7A and 7B illustrate a chip stack 104 according to at least one example embodiment, where FIG. 7A is a cross sectional view and FIG. 7B is a plan view. Although FIGS. 7A and 7B will be discussed with reference to elements of the chip stack 104, it should be appreciated that the same structure of the chip stack 104 in FIGS. 7A and 7B may additionally or alternatively be applied to chip stack 108. FIGS. 7A and 7B include many of the same elements as the previous figures, and as such, a description of these elements is not repeated. However, FIGS. 7A and 7B further illustrate a groove 700 formed in the chip 116 (and/or chip 124 in chip stack 108). As illustrated in FIGS. 7A and 7B, at least a portion of the electrical contact 308 overlaps with the groove 700 of the first chip 116 in the plan view. FIGS. 7A and 7B show an example where an entirety of the electrical contact 308 overlaps with the groove 700, but example embodiments are not limited thereto and less than an entirety of the electrical contact may overlap with the groove 700. As may be appreciated, the groove 700 causes the chip 116 to have a first portion with a first thickness and a second portion with a second thickness less than the first thickness. In this case the portion with the second thickness corresponds to the groove 700.

Although not explicitly illustrated, the chip stack structure in FIGS. 7A and 7B may be repeated for a chip stack 108 and placed into a package that includes a support substrate 112 and bonding wires 420 and 424. In this case, the chip stacks may be aligned with one another or offset from one another as shown in previous figures (e.g., FIGS. 6A and 6B). The chip 116 and the chip 120 may have a same size or footprint and thickness. However, example embodiments are not limited thereto, and the chip 116 and the chip 120 may have difference sizes or footprints and thicknesses.

Here, it should be appreciated that the groove 700 is formed using a thicker scribe line, as shown by scribe line 208 in FIG. 2. However, instead of cutting through the wafer 204 to form a chip that may be included on reconstituted wafer, the groove 700 is formed by cutting partially through the wafer 204. For example, the groove may correspond to cutting about half-way through the wafer 204 or some other desired amount that is based on design parameters of a chip stack.

In addition, it should be appreciated that a wafer having chip 116 in FIG. 7A may be grinded on a surface opposite the bonding structures 300 to form the same or similar structure as that which can be accomplished with a reconstituted wafer (see, for example, FIG. 3A). This enables wafer-to-wafer bonding without reconstitution. That is, wafer-to-wafer bonding has limits on how thin each wafer can be to perform a bonding process, meaning that to form a chip stack with a chip 116 that is thinner than the usual limit, wafer reconstitution or chip to wafer bonding is desired (see FIGS. 3A/3B and FIGS. 5A/5B). However, FIGS. 7A and 7B enable wafer-to-wafer bonding and a thinner overall package because the groove 700 is formed in a wafer that includes chip 116 and then a surface of the chip 116 is grinded back to remove the groove 700 and to expose the electrical contact 308, which allows for connection of a bonding wire as shown in other figures. Thus, the groove 700 enables wafer-to-wafer bonding with original wafers while still allowing for a thinner overall package after grinding.

Figures 8A, 8B:
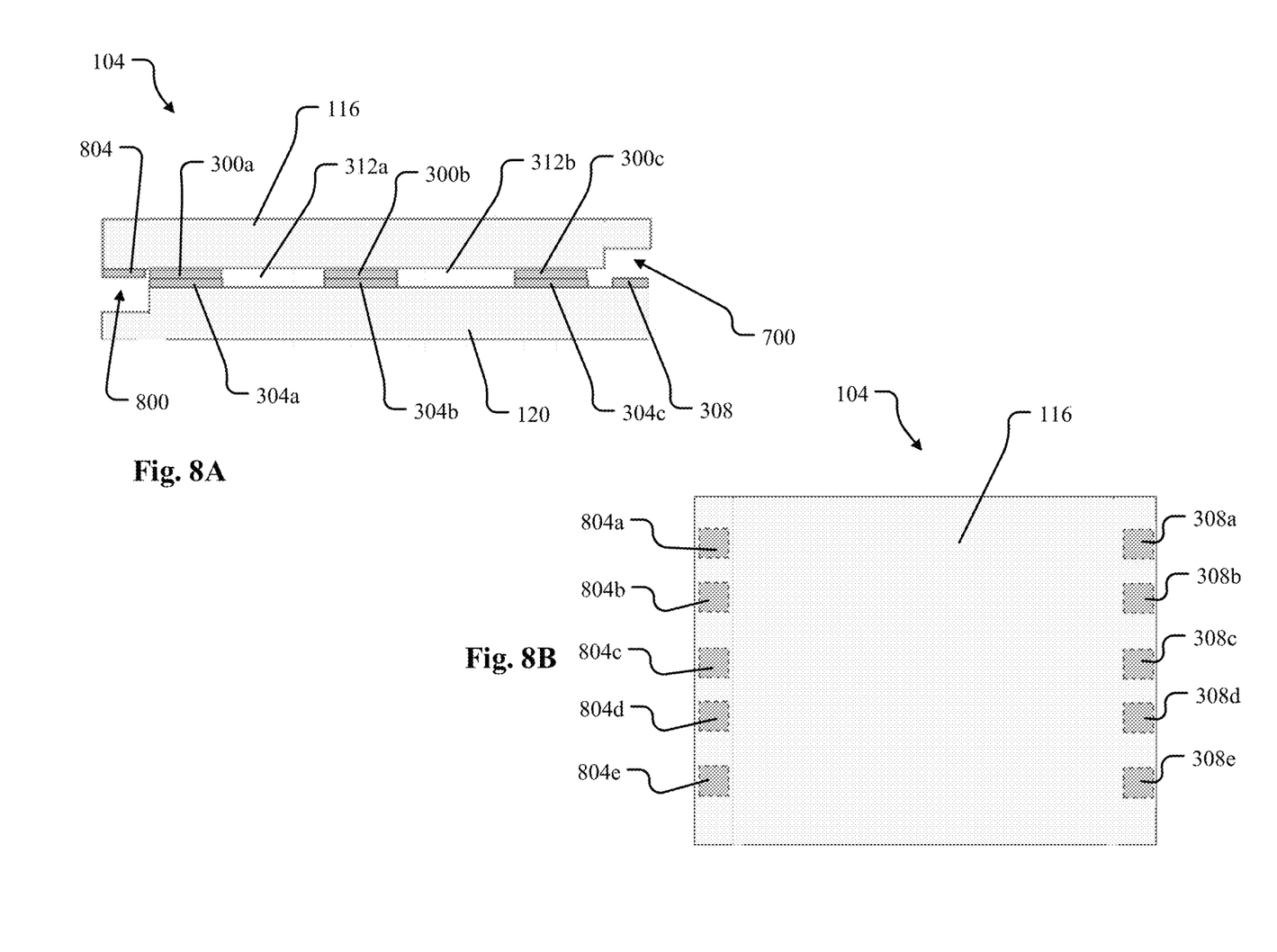
FIG. 8A illustrates a cross sectional view of a chip stack according to at least one example embodiment.
FIG. 8B illustrates a plan view of the chip stack in FIG. 8A according to at least one example embodiment.

FIGS. 8A and 8B illustrate a chip stack 104 according to at least one example embodiment, where FIG. 8A is a cross sectional view and FIG. 8B is a plan view. Although FIGS. 8A and 8B will be discussed with reference to elements of the chip stack 104, it should be appreciated that the same structure of the chip stack 104 in FIGS. 8A and 8B may additionally or alternatively be applied to chip stack 108. FIGS. 8A and 8B include many of the same elements as the previous figures, and as such, a description of these elements is not repeated. However, FIGS. 8A and 8B further illustrate a groove 800 formed in the chip 120 in the same manner as the groove 700 is formed in the chip 116. FIGS. 8A and 8B further illustrate an electrical contact 804 (804a to 804e in FIG. 8B) on a bottom side of the chip 116. Although not explicitly shown, a bonding wire may be electrically connected to the electrical contact 804. As in FIGS. 7A and 7B, the chip 116 and the chip 120 may have a substantially same size or footprint and thickness. However, example embodiments are not limited thereto, and the chip 116 and the chip 120 may have difference sizes or footprints and thicknesses.

In addition, similar to FIGS. 7A and 7B, it should be appreciated that wafer having chips 116 and/or 120 in FIG. 8A may be grinded or thinned on surfaces opposite the bonding structures 300 and 304 to expose contacts 304 and/or 804 in areas of the grooves 700 and/or 800 to form the same or similar structures in FIGS. 3A, 4A, and 6A. As noted above, this process enables wafer-to-wafer bonding to form thinner packages that normally are not possible without reconstitution.

Although not explicitly illustrated, the chip stack structure in FIGS. 8A and 8B may be repeated for a chip stack 108 and placed into a package that includes a support substrate 112 and bonding wires that bond contacts 308 and 804 to the support substrate 112. In this case, the chip stacks may be aligned with one another or offset from one another as shown in previous figures (e.g., FIGS. 6A and 6B).

In view of FIGS. 7A to 8B, it should be understood that in addition to the possibility of forming chip stacks with grooves 700 and/or 800, the structures shown in FIGS. 7A to 8B may also be used as a starting point for forming chip stacks in FIGS. 3A to 6B. For example, as noted above and discussed in more detail with reference to FIG. 9, chip 116 in FIGS. 7A and 8A may be part of a wafer that, after wafer-to-wafer bonding, is grinded from a surface furthest from the bonding structures 300 to effectively remove the groove 700. Likewise, the chip 120 in FIG. 8A may also be grinded back to effectively remove the groove 800. This allows for wafer-to-wafer bonding while keeping the grinded chip(s) thinner (e.g., at about 10 um) than would otherwise be possible with other manufacturing methods.

Figure 9:
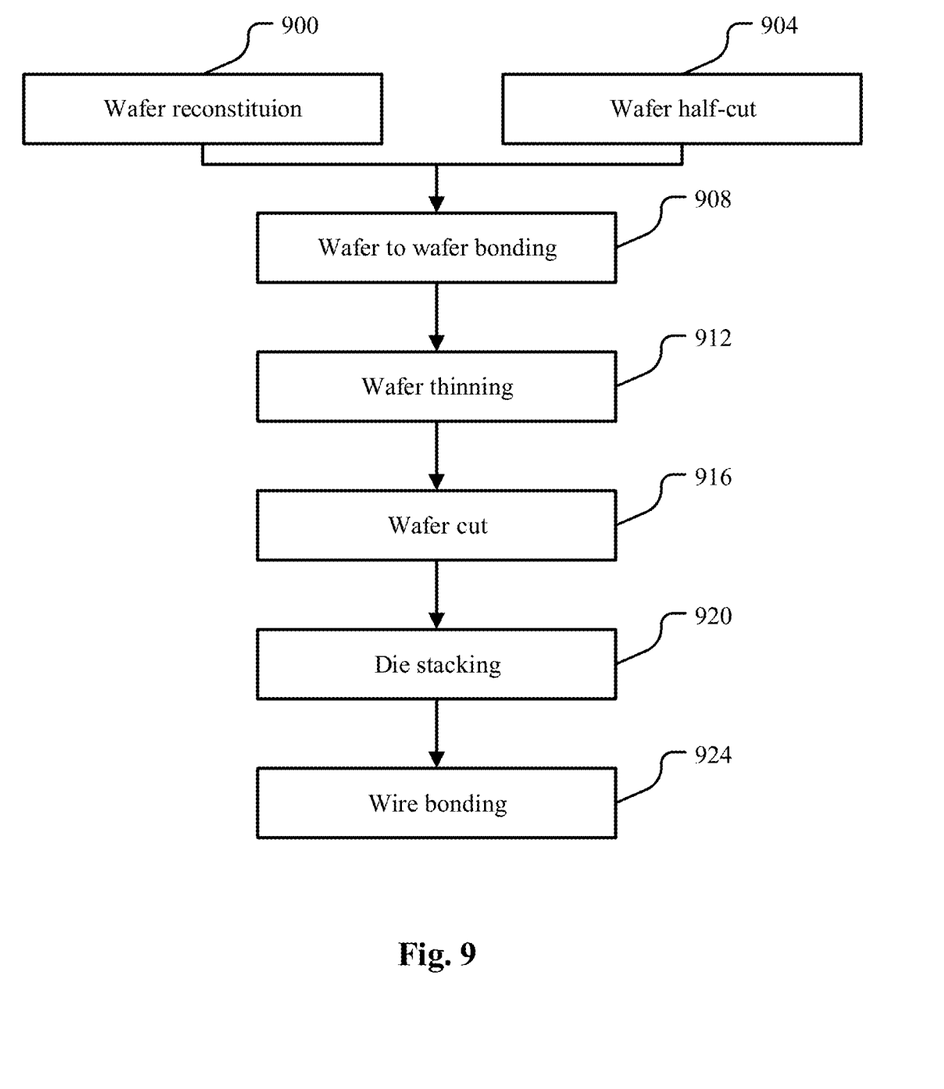
FIG. 9 illustrates methods of manufacturing a chip stack and a package according to at least one example embodiment.

FIG. 9 illustrates methods of manufacturing a chip stack and a package according to at least one example embodiment. For example, FIG. 9 illustrates two methods for manufacturing a chip stack and package, where the two methods have different initial operations 900 or 904 and the same additional operations 908 to 924. The methods illustrated in FIG. 9 may be carried out by various known manufacturing techniques in addition to the techniques described herein. FIG. 9 is discussed with reference to FIGS. 1-8B. In general, the method is performed for two wafers, for example, wafers 204 and 212 that have already undergone processing to form circuitry thereon In a first method of manufacturing, the method begins with operation 900 where a wafer 204 that includes the chip 116 and/or a wafer 212 that includes the chip 120 undergo wafer reconstitution. Wafer reconstitution may proceed in accordance with techniques described above with reference to FIG. 2, for example. Thereafter, the method proceeds to operation 908, described in more detail below.

In a second method of manufacturing, the method begins with operation 904 where a wafer 204 that includes chip 116 and/or a wafer 212 that includes chip 120 is half-cut (or partially cut) along, for example, a scribe line 208 to form a groove 700 and/or 800. For example, operation 904 may form a plurality of grooves in a first wafer 204 along scribe lines 208, where the wafer 204 includes a plurality of first chips 116. In operation 908, the method includes bonding the wafer 204 including the first chips 116 to the wafer 212 including the second chips 120 using, for example, bonding structures 300 and 304. If the method began with operation 900, then at least one of the wafers 204 or 212 is a reconstituted wafer. If the method began with operation 904, then both wafers 204 and 212 may be original wafers (i.e., not reconstituted). Bonding the wafers 204 and 212 forms a bonded structure.

In operation 912, the method includes thinning the wafer 204 and/or the wafer 212 using, for example, a grinding or planarizing process. The wafer 204 and/or the wafer 212 are thinned to a thickness that is based on design preferences. For example, in the event that the method began with operation 900, one or both of the wafers 204 and 212 are thinned to form a desired chip structure, for example, the chip structures in a chip stack from FIG. 3A or FIG. 5A. In the event that the method began with operation 904, one or both of the wafers 204 and 212 are thinned to remove one or both sets of grooves 700 and 800 to arrive at the chip structures of FIG. 3A, 4A, or 6A, for example. Thinning the wafer 204 and/or 212 to remove the plurality of grooves exposes the electrical contacts 308 and/or 800 in the bonded structure formed in operation 908.

In operation 916, the method includes cutting or dicing the wafers 204 and 212 to form individual chip stacks 104 and/or 108. For example, operation 916 incudes dicing the thinned bonded structure from operation 9120 to form a plurality of first chip stacks 104, where each first chip stack 104 includes one of the first plurality of chips 116 and one of the second plurality of chips 120.

In operation 920, the method includes stacking individual chip stacks on one another. For example, as shown in previous figures, a chip stack 108 may be stacked on a chip stack 104. The stack now comprising chip stack 104 and 108 may then be mounted on a support substrate 112. For example, operation 920 includes adhering a plurality of second chip stacks 108 to the plurality of first chip stacks 104 to form a plurality of packages.

In operation 924, the method includes forming bonding wires, for example, bonding wires 420/424 to electrically or mechanically connect contacts (e.g., 308, 500, 804) of each chip stack to the support substrate. That is, operation 924 includes attaching bonding wires to the contacts exposed by the thinning of operation 912.

Forming bonding wires may include a wire looping process known in the art. Here, it should be appreciated that operations 920 and 924 may be swapped if desired. In addition, additional backend processes, such as molding and/or encapsulation or other processes generally desired to complete a package, may occur after operation 924.

In view of FIGS. 1-9, it should be appreciated that features shown in one figure may be applied or incorporated into features shown in another figure without limitation. For example, in a package with two chip stacks, one chip stack may have a structure shown in one figure while the other chip stack may have a structure shown in a different figure. It should also be appreciated that FIGS. 1-9 illustrate example embodiments that provide double density chip packages with face to face, wafer to wafer bonding, which eliminates the need for through silicon vias (TSVs) while still enabling a large number of IO connections. Example embodiments further provide for improved methods of forming thinner packages by virtue of face-to-face wafer bonding without wafer reconstitution.

At least one example embodiment is directed to a package includes a first chip stack including a first chip including first bonding structures, a second chip including second bonding structures facing the first bonding structures and bonded to the first bonding structures, and a first electrical contact on the second chip. At least a portion of the first electrical contact does not overlap with the first chip in a plan view.

According to at least one example embodiment, the first electrical contact is located at a first side of the second chip.

According to at least one example embodiment, the package includes a second electrical contact on the second chip and located at a second side of the second chip opposite the first side of the second chip.

According to at least one example embodiment, at least a portion of the second electrical contact does not overlap with the first chip in the plan view.

According to at least one example embodiment, in a cross sectional view, a width of the first chip is less than a width of the second chip.

According to at least one example embodiment, the package includes a second chip stack adhered to the first chip stack. The second chip stack includes a third chip including third bonding structures, a fourth chip including fourth bonding structures facing the third bonding structures and bonded to the third bonding structures, and a second electrical contact on the fourth chip. At least a portion of the second electrical contact does not overlap with the third chip in the plan view. The package includes a support substrate that supports the first chip stack and the second chip stack.

According to at least one example embodiment, in a cross sectional view, a width of the first chip is less than a width of the second chip, and a width of the third chip is less than a width of the fourth chip. The first electrical contact and the second electrical contact overlap one another in the plan view.

According to at least one example embodiment, the first chip stack and the second chip stack are aligned with one another.

According to at least one example embodiment, the portion of the second electrical contact does not overlap the first chip in the plan view.

According to at least one example embodiment, the first chip stack and the second chip stack are offset from one another.

According to at least one example embodiment, the package includes a first bonding wire electrically connected to the first electrical contact, and a second bonding wire electrically connected to the second electrical contact.

According to at least one example embodiment, the first electrical contact and the second electrical contact overlap in the plan view.

According to at least one example embodiment, the first chip or the second chip, or both, is a reconstituted chip.

At least one example embodiment is directed to a method including forming a plurality of grooves in a first wafer including a plurality of first chips, bonding the first wafer to a second wafer including a plurality of second chips to form bonded structure, thinning the first wafer in the bonded structure to remove the plurality of grooves, and dicing the thinned bonded structure to form a plurality of first chip stacks, each first chip stack including one of the first plurality of chips and one of the second plurality of chips.

According to at least one example embodiment, the first wafer includes a plurality of first bonding structures bonded to a plurality of second bonding structures included on the second wafer.

According to at least one example embodiment, the method includes forming electrical contacts on the second wafer in regions that overlap the plurality of grooves.

According to at least one example embodiment, thinning the first wafer to remove the plurality of grooves exposes the electrical contacts in the bonded structure.

According to at least one example embodiment, the method includes attaching bonding wires to the electrical contacts exposed by the thinning.

According to at least one example embodiment, the method includes adhering a plurality of second chip stacks to the plurality of first chip stacks to form a plurality of packages.

At least one example embodiment is directed to a package including a first chip stack including a first chip including first bonding structures, a second chip including second bonding structures facing the first bonding structures and bonded to the first bonding structures, and a first electrical contact on the second chip. The first electrical contact does not overlap with the first chip in a plan view. The package includes a second chip stack adhered to the first chip stack. The second chip stack includes a third chip including third bonding structures, a fourth chip including fourth bonding structures facing the third bonding structures and bonded to the third bonding structures, and a second electrical contact on the fourth chip. The second electrical contact does not overlap with the third chip in the plan view. The package further includes a support substrate that supports the first chip stack and the second chip stack.

Any one or more of the aspects/embodiments as substantially disclosed herein.

Any one or more of the aspects/embodiments as substantially disclosed herein optionally in combination with any one or more other aspects/embodiments as substantially disclosed herein.

One or more means adapted to perform any one or more of the above aspects/embodiments as substantially disclosed herein.

The phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" means A alone, B alone, C alone, A and B together, A and C together, B and C together, or A, B and C together.

The term "a" or "an" entity refers to one or more of that entity. As such, the terms "a" (or "an"), "one or more," and "at least one" can be used interchangeably herein. It is also to be noted that the terms "comprising," "including," and "having" can be used interchangeably.

Aspects of the present disclosure may take the form of an embodiment that is entirely hardware, an embodiment that is entirely software (including firmware, resident software, micro-code, etc.) or an embodiment combining software and hardware aspects that may all generally be referred to herein as a "circuit," "module," or "system." Any combination of one or more computer-readable medium(s) may be utilized. The computer-readable medium may be a computer-readable signal medium or a computer-readable storage medium.

A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain or store a program for use by or in connection with an instruction execution system, apparatus, or device.

The terms "determine," "calculate," "compute," and variations thereof, as used herein, are used interchangeably and include any type of methodology, process, mathematical operation or technique.

What is claimed is:

1. A package, comprising:
   a first chip stack including:
      a first chip including first bonding structures;
      a second chip including second bonding structures facing the first bonding structures and bonded to the first bonding structures; and
      a first electrical contact on the second chip, wherein at least a portion of the first electrical contact does not overlap with the first chip in a plan view;
   a second chip stack adhering to the first chip stack and including:
      a third chip including third bonding structures;
      a fourth chip including fourth bonding structures facing the third bonding structures and bonded to the third bonding structures; and
      a second electrical contact on the fourth chip, wherein at least a portion of the second electrical contact does not overlap with the third chip in the plan view, wherein the first chip and the third chip have a same first footprint, and wherein the second chip and the fourth chip have a same second footprint different than the first footprint.

2. The package of claim 1, wherein the first electrical contact is located at a first side of the second chip.

3. The package of claim 1, wherein, in a cross sectional view, a width of the first chip is less than a width of the second chip.

4. The package of claim 1, further comprising:
   a support substrate that supports the first chip stack and the second chip stack.

5. The package of claim 4, wherein, in a cross sectional view, a width of the first chip is less than a width of the second chip, and a width of the third chip is less than a width of the fourth chip, and wherein the first electrical contact and the second electrical contact overlap one another in the plan view.

6. The package of claim 4, wherein the first chip stack and the second chip stack are aligned with one another.

7. The package of claim 6, wherein the portion of the second electrical contact does not overlap the first chip in the plan view.

8. The package of claim 4, wherein the first chip stack and the second chip stack are offset from one another.

9. The package of claim 4, further comprising:
   a first bonding wire electrically connected to the first electrical contact; and
   a second bonding wire electrically connected to the second electrical contact.

10. The package of claim 9, wherein the first electrical contact and the second electrical contact overlap in the plan view.

11. The package of claim 1, wherein the first chip or the second chip, or both, is a reconstituted chip.

12. The package of claim 1, wherein the first chip stack and the second chip stack are offset from one another.

13. The package of claim 1, wherein the first chip stack and the second chip stack are aligned with one another.

14. A package, comprising:
   a first chip stack including:
      a first chip including first bonding structures;
      a second chip including second bonding structures facing the first bonding structures and bonded to the first bonding structures;
      a first electrical contact on the second chip, wherein at least a portion of the first electrical contact does not overlap with the first chip in a plan view, and wherein the first electrical contact is located at a first side of the second chip; and
      a second electrical contact on the second chip and located at a second side of the second chip opposite the first side of the second chip.

15. The package of claim 14, wherein at least a portion of the second electrical contact does not overlap with the first chip in the plan view.

16. A package, comprising:
   a first chip stack including:
      a first chip including first bonding structures;
      a second chip including second bonding structures facing the first bonding structures and bonded to the first bonding structures; and
      a first electrical contact on the second chip, wherein the first electrical contact does not overlap with the first chip in a plan view; and
   a second chip stack adhering to the first chip stack and including:
      a third chip including third bonding structures;
      a fourth chip including fourth bonding structures facing the third bonding structures and bonded to the third bonding structures; and
      a second electrical contact on the fourth chip, wherein the second electrical contact does not overlap with the third chip in the plan view; and
   a support substrate that supports the first chip stack and the second chip stack, wherein a width of the first chip is less than a width of the second chip, and a width of the third chip is less than a width of the fourth chip, and wherein the first electrical contact and the second electrical contact overlap one another in the plan view.

17. The package of claim 16, wherein the first chip or the second chip, or both, is a reconstituted chip.

18. The package of claim 16, wherein the first chip stack and the second chip stack are aligned with one another.

19. The package of claim 16, wherein a portion of the second electrical contact does not overlap the first chip in the plan view.

20. The package of claim 16, wherein the first chip stack and the second chip stack are offset from one another.

* * * * *